(12) United States Patent
Kang et al.

(10) Patent No.: US 10,735,149 B2
(45) Date of Patent: Aug. 4, 2020

(54) EYE DIAGRAM MEASUREMENT DEVICE AND EYE DIAGRAM MEASUREMENT METHOD

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Wen-Juh Kang, Hsinchu (TW); Yu-Chu Chen, Hsinchu (TW); Hsun-Wei Kao, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/408,486

(22) Filed: May 10, 2019

(65) Prior Publication Data
US 2020/0014501 A1 Jan. 9, 2020

(30) Foreign Application Priority Data
Jul. 6, 2018 (TW) .............................. 107123556 A

(51) Int. Cl.
*H04L 1/24* (2006.01)
*G01R 31/3185* (2006.01)
(Continued)

(52) U.S. Cl.
CPC .......... *H04L 1/24* (2013.01); *G01R 31/31922* (2013.01); *G01R 31/318527* (2013.01); *H04L 1/205* (2013.01)

(58) Field of Classification Search
CPC ... H04L 1/24; H04L 1/205; G01R 31/318527; G01R 31/31922
See application file for complete search history.

(56) References Cited

U.S. PATENT DOCUMENTS

| | | | |
|---|---|---|---|
| 2003/0097226 A1* | 5/2003 | Waschura | H04L 1/24 702/65 |
| 2003/0177438 A1* | 9/2003 | Waschura | H04L 1/24 714/819 |

(Continued)

FOREIGN PATENT DOCUMENTS

TW I580230 B 4/2017

*Primary Examiner* — Freshteh N Aghdam
(74) *Attorney, Agent, or Firm* — CKC & Partners Co., LLC

(57) ABSTRACT

An eye diagram measurement device includes a first mapping circuitry, a count circuitry, a second mapping circuitry and a memory circuitry. The first mapping circuitry maps one of plurality of internal signals of an electronic device to a first data signal having a predetermined number of bits. The counter circuitry performs a counting operation according to the first data signal and a plurality of signal values associated with the predetermined number of bits, to generate a plurality of count signals. The second mapping circuitry maps the count signals respectively to a plurality of eye diagram measurement signals corresponding to a present phase. The memory circuitry stores the eye diagram measurement signals in order to provide the eye diagram measurement signals to an external system for generating an eye diagram measurement result of the electronic device.

18 Claims, 4 Drawing Sheets

(51) Int. Cl.
*G01R 31/319* (2006.01)
*H04L 1/20* (2006.01)

(56) References Cited

U.S. PATENT DOCUMENTS

2007/0018985 A1* 1/2007 Campiche ............. G06T 11/206
                                                        345/440
2007/0047680 A1* 3/2007 Okamura .................. H04L 1/24
                                                        375/348
2017/0019219 A1* 1/2017 Leizerovich ............ H04L 1/205

* cited by examiner

EYE DIAGRAM MEASUREMENT DEVICE AND EYE DIAGRAM MEASUREMENT METHOD

RELATED APPLICATIONS

This application claims priority to Taiwan Application Serial Number 107123556, filed Jul. 6, 2018, which is herein incorporated by reference in its entirety.

BACKGROUND

Technical Field

The present disclosure relates to an eye diagram measurement device. More particularly, the present disclosure relates to an eye diagram measure device capable of measuring signals having multiple levels, and an eye diagram measurement method.

Description of Related Art

An eye diagram has been applied commonly to the measurement of quality of the signals. The larger the eye height and/or the eye width are in the eye diagram, the better the quality of the measured signal is.

As the speed of data transmission is increasingly faster, the applications of multilevel signal decoding which adopts pulse-amplitude modulation (PAM) signals, and so on, are more and more popular. However, the prior eye diagram measurement circuit is only applied to measuring non-return-to-zero (NRZ) encoded signals and is not suitable for the applications mentioned above.

SUMMARY

In order to solve the problem mentioned above, one aspect of the present disclosure is to provide an eye diagram measurement device which includes a first mapping circuitry, a count circuitry, a second mapping circuitry, and memory circuitry. The first mapping circuitry is configured to map one of a plurality of internal signals of an electronic device to a first data signal having a predetermined number of bits. The counter circuitry is configured to perform a counting operation, according to the first data signal and a plurality of signal values associated with the predetermined number of bits, to generate a plurality of count signals. The second mapping circuitry is configured to map the count signals respectively to a plurality of eye diagram measurement signals corresponding to a present phase. The memory circuitry is configured to store the eye diagram measurement signals in order to provide the eye diagram measurement signals to an external system for generating an eye diagram measurement result of the electronic device.

Some aspects of the present disclosure provide an eye diagram measurement method which includes the following operations: mapping one of a plurality of internal signals of an electronic device to a first data signal having a predetermined number of bits, performing a counting operation according to the first data signal and a plurality of signal values associated with the predetermined number of bits, to generate a plurality of count signals, mapping the count signals respectively to a plurality of eye diagram measurement signals corresponding to a present phase, and storing the eye diagram measurement signals in order to provide the eye diagram measurement signals to an external system for generating an eye diagram measurement result of the electronic device.

As described above, the eye diagram measurement device and the eye diagram measurement method provided in the present disclosure may be applied to measuring the signals having multiple levels and providing the statistical function of signal values at the same time.

DETAILED DESCRIPTION

All the terms used in this document generally have their ordinary meanings. The examples of using any terms discussed herein such as those defined in commonly used dictionaries are illustrative only, and should not limit the scope and meaning of the disclosure. Likewise, the present disclosure is not limited to some embodiments given in this document.

In this document, it may be understood that the terms "first," "second," and "third" are to describe the various elements, components, zones, levels and/or blocks. However, these elements, components, zones, levels and/or blocks should not be limited by these terms. These terms are used to distinguish one element, component, zone, level and/or block from another. For example, a first element, component, zone, level and/or block may be termed a second element, component, zone, level and/or block without departing from the scope of the present disclosure. As used herein, the term "and/or" includes any and all combinations of one or more of the associated listed items.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals.

Figure 1:
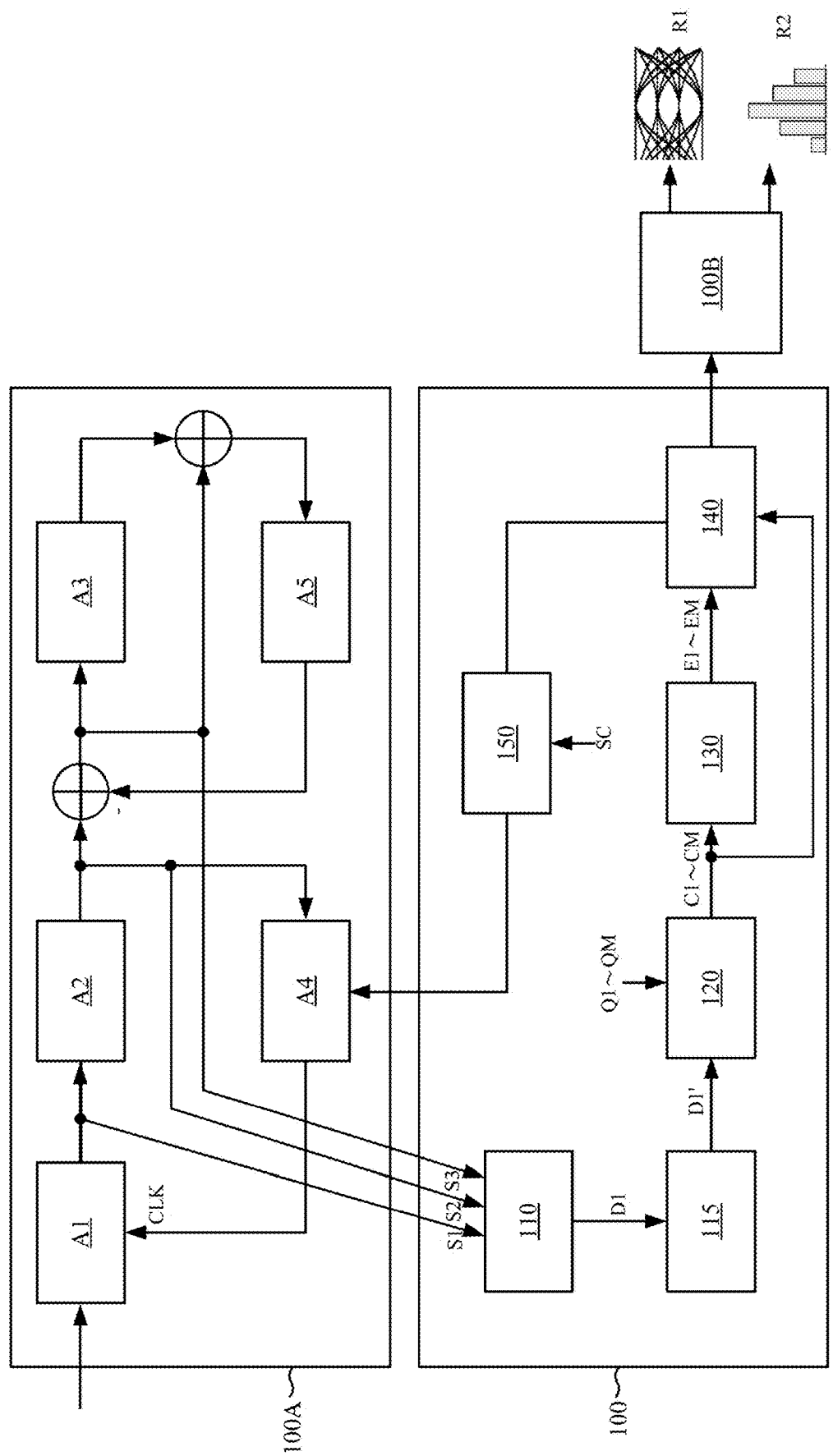
FIG. 1 is a schematic diagram of an eye diagram measurement device, according to some embodiments of the present disclosure.

Reference is now made to FIG. 1. FIG. 1 is a schematic diagram of an eye diagram measurement device 100, in accordance with some embodiments of the present disclosure. In some embodiments, the eye diagram measurement device 100 can be configured to measure many signals of an electronic device (such as a receiver 100A, to which the present disclosure is not limited). The receiver 100A includes an analog-to-digital converter (ADC) A1, a feed-forward equalizer A2, a slicer A3, a clock and data recovery circuit A4, and a decision feedback circuit A5, etc., but the present disclosure is not limited thereto.

As shown in FIG. 1, the eye diagram measurement device 100 is configured to measure internal signals S1-S3 of the receiver 100A, such as an output signal of the ADC A1, an output signal of the feed-forward equalizer A2 and an input signal of the slicer A3, etc. The internal signals S1-S3 mentioned above are given for illustration. Various signals of the receiver 100A may also be measured with the eye diagram measurement device 100.

In some embodiments, the eye diagram measurement device 100 includes a mapping circuitry 110, a counter circuitry 120, a mapping circuitry 130, and a memory circuitry 140.

The mapping circuitry 110 is coupled to internal nodes of the receiver 100A in order to receive the internal signal S1-S3. The mapping circuitry 110 is configured to map one of the internal signals S1-S3 to a data signal D1. In some embodiments, the numbers of bits of the internal signals S1-S3 are different from each other. With the mapping circuitry 110, the internal signals S1-S3 having different numbers of bits can be mapped to the data signal D1 which has a predetermined number of bits.

The counter circuitry 120 is coupled to the mapping circuitry 110 in order to receive the data signal D1. In some embodiments, the counter circuitry 120 is configured to perform, according to the data signal D1 and a plurality of signal values Q1-QM, a counting operation for generating a plurality of count signals C1-CM. In some embodiments, the signal values Q1-QM described above are associated with the predetermined number of bits of data signal D1. For example, if the predetermined number of bits is 7 bits, the signal values Q1-QM can be sequentially 0, 1 . . . $2^7-1$. When the data signal D1 is the same as one of the signal values Q1-QM, the counter circuitry 120 performs the counting operation to update the corresponding one of the count signals C1-CM. In this way, by observing the count signals C1-CM, the corresponding signal values of the measured data signals D1 associated with each one of the present phases are determined. The operation described here will be illustrated in the following paragraph with reference to FIG. 3.

By setting the signal values Q1-QM, the signal values of various levels of data signal D1 may be measured. In other word, in the present disclosure, the data form of the data signal D1 may be a pulse-amplitude modulation (PAM) signal having multiple levels, but the present disclosure is not limited thereto.

The mapping circuitry 130 is coupled to the counter circuitry 120 to receive the count signals C1-CM. In some embodiments, the mapping circuitry 130 maps the count signals C1-CM to a plurality of eye diagram measurement signals E1-EM, wherein the count signals C1-CM correspond respectively to the eye diagram measurement signals E1-EM, and the eye diagram measurement signals E1-EM correspond to the present phase of clock signal CLK outputted by the clock and data recovery circuit A4 in the receiver 100A. For example, when the clock signal CLK is on the present phase, the count signal C1 is updated and the remaining count signals C2-CM are all not updated, the eye diagram measurement signal E1 has a logical value 1 and the remaining eye diagram measurement signals E2-EM have logical values 0. In other words, in this example, by the eye diagram measurement signals E1-EM, it may be confirmed that the signal value of the data signal D1 on the present phase is the same as a signal value of the signal values Q1-QM corresponding to the count signal C1.

The memory circuitry 140 is coupled to the counter circuitry 120 to receive the count signals C1-CM and is connected to the mapping circuitry 130 to receive the eye diagram measurement signals E1-EM. In some embodiments, the memory circuitry 140 is configured to store the count signals C1-CM and/or the eye diagram measurement signals E1-EM. In some embodiments, the memory circuitry is coupled to an external system 100B to transmit the count signals C1-CM and/or the eye diagram measurement signals E1-EM to the external system 100B. In some embodiments, the memory circuitry 140 may be implemented with the circuits, such like a register and/or a memory, etc.

The external system 100B can plot the eye diagram measurement signals E1-EM to generate an eye diagram measurement result R1 and by analyzing the count signals C1-CM generate a statistical result R2. In some embodiments, the statistical result R2 may be a histogram which displays the numbers of times that the data signal D1 on the present phase is the same as each one of the signal values Q1-QM.

In some embodiments, the external 100B may include a signal analysis software or implement tools executed by a processor. In some embodiments, the external system 100B may be an oscilloscope. The arrangements of the external system 100B mentioned above are given for illustrative purposes, and the present disclosure is not limited thereto.

For ease of understanding, FIG. 1 shows only one set of the mapping circuitry 110, but the present disclosure is not limited thereto. In some applications, the eye diagram measurement device 100 may be configured with more groups of the mapping circuitries 110, wherein the mapping circuitries operate in parallel to receive more different internal signals from the receiver 100A. In these embodiments, as shown in FIG. 1, the eye diagram measurement device 100 further includes a buffer circuitry 115 coupled between the mapping circuitry 110 and the counter circuitry 120. In this condition, the buffer circuitry 115 may buffer a plurality of the data signals D1 outputted from the mapping circuitries 110 in order to synchronize the data signals D1 and output the data signals D1 as a plurality of data signals D1' sequentially to the counter circuitry 120. In some embodiments, the buffer circuitry 115 may be implemented with a first-in-first-out (FIFO) circuit, but the present disclosure is not limited thereto. In some other embodiments, the mapping circuitry 110 may transmit the data signals D1, without setting the buffer circuitry 115, to the counter circuitry 120.

In some embodiments, as shown in FIG. 1, the eye diagram measurement device 100 further includes the phase control circuitry 150. The phase control circuitry 150 is coupled to the memory circuitry 140 and the receiver 100A. The phase control circuitry 150 is coupled to the feed-forward equalizer A2, the slicer A3 and/or the clock and data recovery circuit A4. In some embodiments, when the memory circuitry 140 stores the eye diagram measurement signals E1-EM corresponding to the present phase, the phase control circuitry 150 controls, according to a control signal SC, the circuit in the receiver 100A (i.e., the feed-forward equalizer A2, the slicer A3 and/or the clock and data recovery circuit A4) to switch the phase of the clock signal CLK from the present phase to the next phase. Therefore, the eye diagram measurement device 100 can continually measure the eye diagram measurement signals E1-EM corresponding to the next phase.

The arrangements of the circuitry embodiment described above will be illustrated in the following paragraph, but the present disclosure is not limited thereto.

Figure 2:
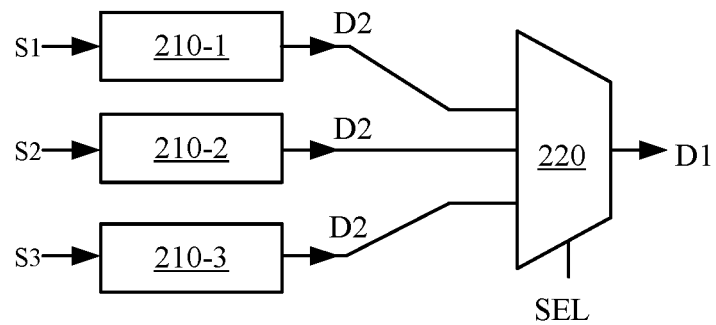
FIG. 2 is a schematic diagram of the mapping circuitry in FIG. 1, according to some embodiments of the present disclosure.

Reference is now made to FIG. 2. FIG. 2 is a schematic diagram of the mapping circuitry 110 in FIG. 1, according to some embodiments of the present disclosure. For ease of understanding, the similar elements in FIG. 1 and FIG. 2 will be designated with the same reference numbers.

In some embodiments, the mapping circuitry 110 includes a plurality of bit conversion circuits 210-1 to 210-3 and a multiplexer 220. The bit conversion circuits 210-1 to 210-3 are coupled respectively to the output of the ADC A1, the output of the feed-forward equalizer A2 and the input of the slicer A3 in order to receive the internal signals S1-S3 respectively.

In some embodiments, the bit conversion circuits 210-1 to 210-3 generate, according to the internal signals S1-S3, a plurality of data signals D2, wherein the number of bits of each one of the data signals D2 is the same as the predetermined number of bits mentioned above. In some embodiments, each one of bit conversion circuits 210-1 to 210-3 extracts, according to the corresponding internal signal of the internal signals S1-S3, the corresponding second data signal D2. Taking the bit conversion circuit 210-1 as an example, the bit conversion circuit 210-1 can exact the partial bits of the internal signal S1 (i.e., the partial bits of the least significant bit (LSB) of the internal signal S1) to generate the corresponding data signal D2. On the same principle, the bit conversion circuit 210-2 or 210-3 may extract the partial bits of the internal signal S2 or S3 to generate the corresponding data signal D2.

The arrangements of the bit conversion circuits 210-1 to 210-3 described above are given for illustrative purposes and the various ways to generate the data signal D2 having a fixed number of bits are within the contemplated scope of the present disclosure.

The multiplexer 220 is coupled with the bit conversion circuits 210-1 to 210-3 to receive the data signals D2. The multiplexer 220 outputs, according to a selecting signal SEL, a signal of the second data signals D2 as the data signal D1. In some embodiments, the multiplexer 220 may be implemented with the groups of switches, but the present disclosure is not limited thereto.

Moreover, In some embodiments, the mapping circuitry 110 may further include a switch circuit (not shown in the diagram) which determines, according to an enable signal (not shown in the diagram), to output the data signal D1 to the counter circuitry 120. In other words, with the arrangement above, the eye diagram measurement device 100 may determine, according to the enable signal, to perform an eye diagram measurement operation.

Figure 3:
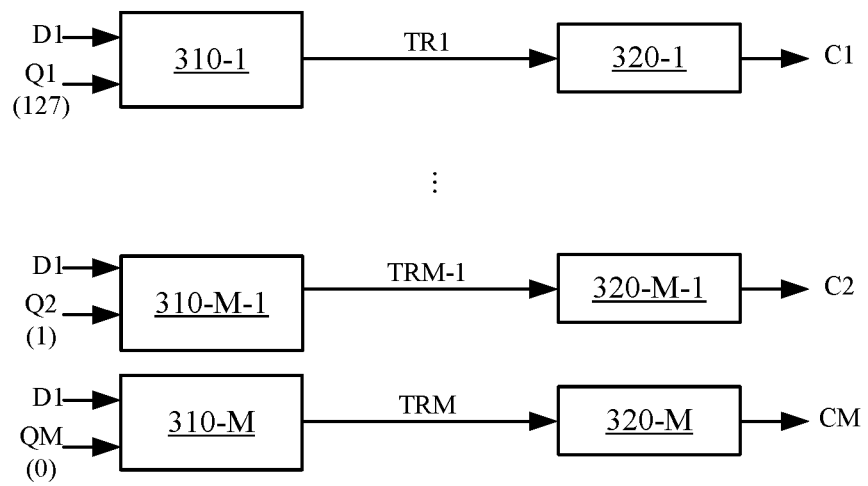
FIG. 3 is a schematic diagram of the counter circuitry in FIG. 1, according to some embodiments of the present disclosure.

Reference is now made in FIG. 3. FIG. 3 is a schematic diagram of the counter circuitry 120 in FIG. 1, according to some embodiments of the present disclosure. For ease of understanding, the similar elements in FIG. 1 and FIG. 3 will be designated with the same reference numbers.

In some embodiments, the counter circuitry 120 includes a plurality of processing circuits 310-1 to 310-M and a plurality of counters 320-1 to 320-M. The processing circuits 310-1 to 310-M are coupled to the mapping circuitry 110 to receive the data signal D1. The number of processing circuits 310-1 to 310-M is associated with the predetermined number of bits as mention above. For example, if the predetermined number of bits is 7, the number of the processing circuits 310-1 to 310-M is $2^7$.

The processing circuits 310-1 to 310-M compare the data signal D1 with the signal values Q1-QM respectively to generate a plurality of trigger signals TR1-TRM. Wherein when it is confirmed that the data signal D1 is the same as one of the signal values Q1-QM, the corresponding one of the processing circuits 310-1 to 310-M outputs a trigger signal with a first logical value (i.e., logical value 1). On the contrary, when it is confirmed that the data signal D1 is different from one of the signal values Q1-QM, the corresponding one of the processing circuits 310-1 to 310-M outputs a trigger signal with a second logical value (i.e., logical value 0).

For example, the predetermined number of bits is assumed to 7 and the processing circuit 310-1 is configured to compare the data signal D1 with signal value Q1 (that is $2^7-1=127$). When the data signal D1 is the same as the signal value Q1, the processing circuit 310-1 outputs the trigger signal TR1 with logical value 1. In addition, under this condition, the data signal D1 is different from the remaining signal values Q2 to QM, as a result, the remaining processing circuits 310-2 to 310-M output the trigger signals TR2-TRM with logical value 0. By the arrangement described above, by the trigger signals TR1-TRM, the signal value of the data signal D1 on the present phase may be determined.

In some embodiments, the processing circuits 310-1 to 310-M may be implemented with the comparators. In some embodiments, the processing circuits 310-1 to 310-M may be implemented with an exclusive NOR gate (XNOR gate) or the logic circuits with the same function as XNOR gate. The arrangements of the embodiment of the processing circuits 310-1 to 310-M described above are given for illustrative purposes, and the various ways to implement the same functions are within the contemplated scope of the present disclosure.

The counter 320-1 to 320-M is coupled respectively to the processing circuits 310-1 to 310-M to receive the trigger signals TR1-TRM. The counters 320-1 to 320-M perform, according to the trigger signals TR1-TRM respectively, a counting operation to generate the count signals C1-CM. When one of the trigger signals TR1-TRM has the first logical value, a corresponding counter of the counters 320-1 to 320-M performs a counting operation to update a corresponding count signal of the count signals C1-CM.

For example, initially the count signals C1-CM are logical value 0. When the trigger signal TR1 has the first logical value (that is logic 1) and the remaining trigger signals TR2-TRM have the second logical value (logic 0), the trigger signal TR1 has logical value 1 and the remaining trigger signals have logical value 0. Under this condition, the counter 320-1 makes a response to the trigger signal TR1 having logical value 1 to perform a counting operation to increase the count signal C1 from logical value 0 to logical value 1. Likewise, the remaining counters 320-2 to 320-M make responses to the trigger signals TR2-TRM not to perform a counting operation. Hence, the remaining count signals C2 to CM are not updated and remaining logical value 0.

As described above, the external system 100B can generate, by analyzing the count signals C1-CM, the statistical result R2. For example, by analyzing the number of times the count signal C1 is updated, the number of times the data signal D1 is the same as the signal value Q1 (that is 127) can be counted. On the same principle, by recording and analyzing the count signals C1-CM, the number of times the data signal D1 is identical to each of the signal values Q1-QM can be counted to generate the statistical result R2.

For ease to understating, FIG. 3 shows only one group of the processing circuits 310-1 to 310-M, but the present disclosure is not limited thereto. In some embodiments, the counter circuitry 120 may be configured with more groups of processing circuits 310-1 to 310-M, wherein the groups of processing circuits 310-1 to 310-M operate in parallel to increase the efficiency. In these embodiments, the counter circuitry 120 further includes a plurality of adders, registers and other logic circuits in order to sum up each one of the corresponding trigger circuits of groups of the processing circuits 310-1 to 310-M.

The arrangements of the counter circuitry 120 described above are given for illustrative purposes and the various ways to implement the same function are within the contemplated scope of the present disclosure.

Figure 4:
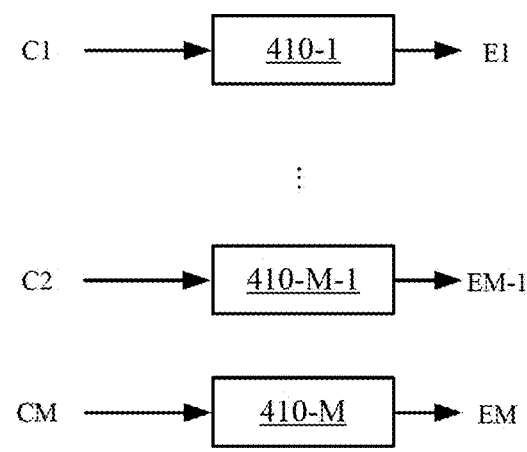
FIG. 4 is a schematic diagram of the mapping circuitry in FIG. 1, according to some embodiments of the present disclosure.

Reference is now made to FIG. 4. FIG. 4 is a schematic diagram of the counter circuitry 130 in FIG. 1, according to some embodiments of the present disclosure. For ease of understanding, the similar elements in FIG. 1 and FIG. 4 will be designated with the same reference numbers.

In some embodiments, the mapping circuitry 130 includes a plurality of logic circuits 410-1 to 410-M. The logic circuits 410-1 to 410-M are coupled respectively to the counters 320-1 to 320-M shown in FIG. 3 to receive the count signals C1-CM. Each one of the logic circuits 410-1 to 410-M is configured to perform, according to a corresponding count signal of the count signals C1-CM, a logic OR operation in order to generate a corresponding eye diagram measurement signal of the eye diagram measurement signals E1-EM.

For example, the logic circuit 410-1 can perform, according to all the count signals C1 received in a designate time period, the logic OR operation to generate the eye diagram measurement signal E1. For instance, when the clock signal CLK is on the present phase and the signal value of data signal D1 is 127 (that is signal value Q1), the trigger signal TR1 remains 1 and continually updates the count signal C1 so that the count signal C1 is at least 1. Hence, in the period of time as the clock signal CLK is on the present phase, the logic circuit 410-1 generates, according to the count signal C1, the eye diagram measurement signal E1 with a logical value 1. Equivalently, the eye diagram measurement signal E1 with a logical value 1 may be configured to represent that when the clock signal CLK is on the present phase, the signal value of the data signal D1 was configured to be the same as the signal value 127.

With the continued example above, since the signal value of the data signal D1 is 127 and different from the remaining signal values Q2-QM, the trigger signals TR2-TRM continually remains 0 and do not update the count signals C2-CM so that the count signals C2-CM remain 0. In this way, the logic circuits 410-2 to 410-M generate, according to the count signals C2-CM, the eye diagram measurement signals E2-EM with a logical value 0. Equivalently, the eye diagram measurement signals E2-EM with logical value 0 may be configured to represent that when the clock signal is on the present phase the signal value of the data signal D1 was configured to be different from the remaining signal values Q2-QM.

As described above the logic circuits 410-1 to 410-M performing the logic OR operation are given for illustrative purpose, but the present disclosure is not limited thereto. Various kinds of logic circuits for detecting the update of the count signals C1-CM may be implemented with the logic circuits 410-1 to 410-M.

Figure 5:
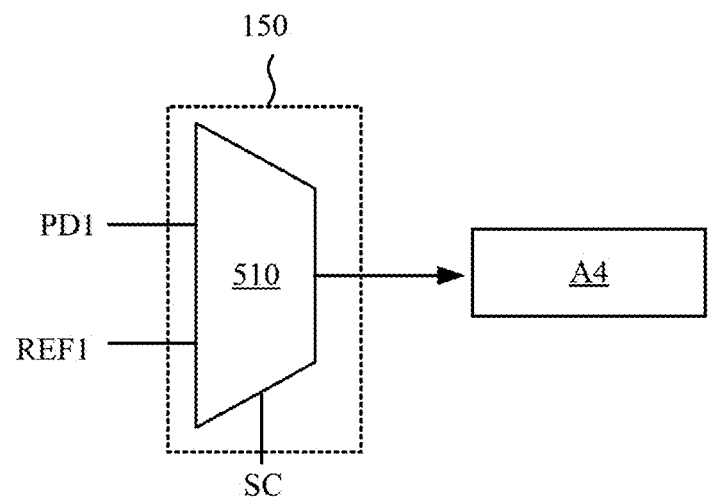
FIG. 5 is a schematic diagram of the phase control circuitry in FIG. 1, according to some embodiments of the present disclosure.

Reference is now made to FIG. 5. FIG. 5 is a schematic diagram of the phase control circuitry 150 in FIG. 1, according to some embodiments of the present disclosure. For ease of understanding, the similar elements in FIG. 1 and FIG. 5 will be designated with the same reference numbers.

The phase control circuitry 150 includes a multiplexer circuit 510. The multiplexer circuit 510 is configured to output, according to the control signal SC, one of a predetermined value PD1 associated with the receiver 100A and a reference measurement values REF1 to the clock and data recovery circuit A4 of the receiver 100A, in order to switch the phase of the clock signal CLK1 from the present phase to a next phase. In some embodiments, the predetermined value PD1 may be a parameter of the internal circuit of the receiver 100A, such as a control parameter of the clock and data recovery circuitry A4 or a setting value of a circular shift register, etc., but the present disclosure is not limited thereto.

In some embodiments, by outputting the reference measurement value REF1 to the receiver 100A, the eye diagram measurement device 100 can more easily confirm and control the phase of the clock signal CLK to measure the eye diagram. However, in some situation, if the reference measurement signal REF1 is configured to change the phase of the clock signal CLK, it may induce the incorrect operation of the receiver 100A. For this situation, by outputting the predetermined value PD1 to the receiver 100A, the receiver 100A can be operated correctly. Hence, the eye diagram measurement device 100 can be prevented from measuring the incorrect eye diagrams.

Figure 6:
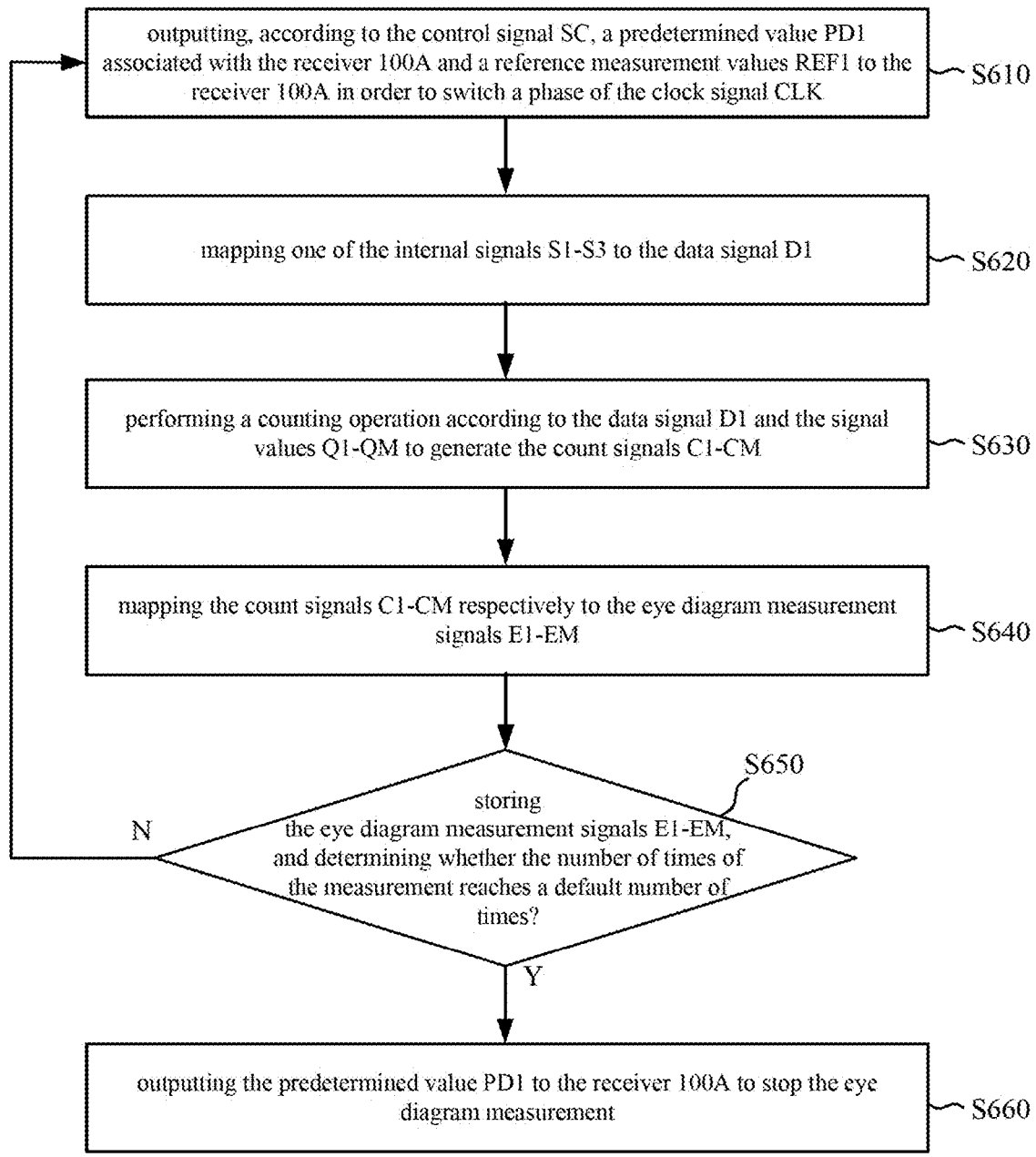
FIG. 6 is a flowchart of an eye diagram measurement method, according to some embodiments of the present disclosure.

FIG. 6 is a flowchart of an eye diagram measurement method 600, according to some embodiments of the present disclosure. For ease of understanding, the eye diagram measurement method 600 will be described with reference to the diagrams mentioned above.

In operation S610, one of a predetermined value PD1 associated with the receiver 100A and a reference measurement value is output, according to the control signal SC, to the receiver 100A, in order to switch a phase of the clock signal CLK.

For example, as shown in FIG. 5, the phase control circuitry 150 may output the reference measurement value REF1 to the receiver 100A to control the phase to the clock signal CLK. Alternately, to avoid affecting the operation of receiver 100A, the phase control circuitry 150 may output the predetermined value PD1 to the receiver 100A.

In operation S620, one of the internal signals S1-S3 is mapped the data signal D1. For example, as shown in FIG. 2, the mapping circuitry 110, by exacting the partial bits of the internal signals S1-S3, may generate the data signal D1. Equivalently, by operating S620, the internal signal S1-S3 probably having different numbers of bits may be converted to the data signals having same number of bits (i.e., the data signal D2 shown in FIG. 2).

In operation S630, a counting operation is performed, according to the data signal D1 and the signal values Q1-QM, to generate the count signals C1-CM.

For example, as shown in FIG. 3, when the data signal D1 is confirmed to be the same as the signal value Q1 (127 for example), the processing circuit 310-1 outputs the trigger signal TR1 having a logical value 1. Hence, the counter 320-1 makes response to TR1 to perform a counting operation to update the count signal C1. Under this condition, when the data signal D1 is different from the remaining signal values Q2-QM, the processing circuits 310-2 to 310-M output the trigger signals TR2-TRM with the logical value 0. As a result, the counters 320-2 to 320-M make response to the trigger signals TR2-TRM not to perform a counting operation to update the count signals C2-CM.

In operation S640, the count signals C1-CM are mapped respectively to the eye diagram measurement signals E1-EM. For example, as shown in FIG. 4 above, the mapping circuitry 130 can perform a logic OR operation respectively to the count signals C1-CM received in a period of time to generate the eye diagram measurement signals E1-EM.

In operation S650, the eye diagram measurement signals E1-EM are stored and whether the number of times of the measurement is determined to reach a default number of times. If it does, the operation S660 is performed; if it does not, the operation S610 is performed.

As shown in FIG. 1, the memory circuitry 140 can store the count signals C1-CM and/or the eye diagram measurement signals E1-EM in order to provide to the external system 100B for analyzing and generating the statistical result R2 and/or the eye diagram measurement result R1. In some embodiments, the external system 100B can collect the eye diagram measurement signals E1-EM associated with different phases to generate the eye diagram measurement result R1. By determining the default number of times, a certain amount of the eye diagram measurement signals E1-EM can be collected and supplied to the external system 100B. For example, the default number of times is set to 512. When the number of times of measurement is under 512, by repeating the operation S610, the phase control circuitry 150 may control the receiver 100A to switch the phase of the clock signal CLK to the next phase in order to collect the eye diagram measurement signals E1-EM corresponding to the next phase.

In operation S660, it is to output the predetermined value PD1 to the receiver 100A to stop the eye diagram measurement. After collecting a sufficient amount of the eye diagram measurement signals E1-EM, the external system 100B can generate accordingly the eye diagram measurement result R1. Hence, the phase control circuitry 150 may output the predetermined value PD1 to the receiver 100A to cause the receiver 100A to return to the original operation.

The process of the eye diagram measurement method 600 described above are given for illustrative purpose, but the operations are not necessarily performed in the same order as described above. The order of the operations of the eye diagram measurement method 600 may be changed, alternated or omitted appropriately, in accordance with the spirit and scope of various embodiments of the present disclosure.

As described above, the eye diagram measurement device and the eye diagram measurement method provided in the present disclosure may be applied to measuring the signals having multiple levels and providing the statistical function of signal values at the same time.

While the disclosure has been described by way of example(s) and in terms of the preferred embodiment(s), it is to be understood that the disclosure is not limited thereto. Those skilled in the art may make various changes, substitutions, and alterations herein without departing from the spirit and scope of the present disclosure. In view of the foregoing, it is intended that the present invention cover modifications and variations of this invention provided they fall within the scope of the following claims.

What is claimed is:

1. An eye diagram measurement device, comprising:
    a first mapping circuitry configured to map one of a plurality of internal signals of an electronic device to a first data signal having a predetermined number of bits;
    a counter circuitry configured to perform a counting operation according to the first data signal and a plurality of signal values associated with the predetermined number of bits, to generate a plurality of count signals;
    a second mapping circuitry configured to map the count signals respectively to a plurality of eye diagram measurement signals corresponding to a present phase; and
    a memory circuitry configured to store the eye diagram measurement signals in order to provide the eye diagram measurement signals to an external system for generating an eye diagram measurement result of the electronic device,
    wherein the second mapping circuitry comprises:
    a plurality of logic circuits configured to perform, according to the count signals respectively, a plurality of logical OR operations to generate the eye diagram measurement signals.

2. The eye diagram measurement device of claim 1, wherein the first mapping circuitry comprises:
    a plurality of bit conversion circuits configured to generate a plurality of second data signals, wherein a number of bits of each one of the second signals is the same as the predetermined number of bits, and each one of the bit conversion circuits is configured to extract a corresponding second data signal of the second data signals from a corresponding internal signal of the internal signals; and
    a multiplexer circuit configured to receive the second data signals and output, according to a selecting signal, one of the second data signals as the first data signal.

3. The eye diagram measurement device of claim 1, wherein the count circuitry comprises:
    a plurality of processing circuits configured to compare the first data signal with the signal values respectively, to output a plurality of trigger signals, wherein a first trigger signal of the trigger signals indicates that the first data signal is the same as a first signal value of the signal values; and
    a plurality of counters configured to determine, according to the trigger signals respectively, to perform a counting operation to output the count signals, wherein when a first counter of the counters receives the first trigger signal, the first counter performs a counting operation to update a corresponding count signal.

4. The eye diagram measurement device of claim 3, wherein a plurality of second trigger signals of the trigger signals indicate that the first data signal is different from remaining signal values of the signal values, and when remaining counters of the counters receive the second trigger signals, the remaining counters do not perform the counting operation.

5. The eye diagram measurement device of claim 1, wherein the memory circuitry is further configured to store the count signals to provide the count signals to the external system for generating a statistic result associated with the present phase.

6. The eye diagram measurement device of claim 1, further comprising:
    a phase control circuitry configured to provide, according to a control signal, an eye diagram measurement value and one of a predetermined value associated with the electric device to a clock and data recovery circuit in the electronic device, in order to switch a phase of a clock signal of the electronic device from the present phase to a next phase.

7. The eye diagram measurement device of claim 1, wherein the first data signal is a pulse-amplitude modulation signal.

8. The eye diagram measurement device of claim 2, wherein the first data signal is a pulse-amplitude module.

9. The eye diagram measurement device of claim 3, wherein the first data signal is a pulse-amplitude module.

10. An eye diagram measurement method, comprising:
mapping one of a plurality of internal signals of an electronic device to a first data signal having a predetermined number of bits;
performing a counting operation according to the first data signal and a plurality of signal values associated with the predetermined number of bits, to generate a plurality of count signals;
mapping the count signals respectively to a plurality of eye diagram measurement signals corresponding to a present phase; and
storing the eye diagram measurement signals in order to provide the eye diagram measurement signals to an external system for generating an eye diagram measurement result of the electronic device,
wherein mapping the count signals to the eye diagram measurement signals respectively comprises:
performing, according to the count signals respectively, a plurality of logical OR operations to generate the eye diagram measurement signals.

11. The eye diagram measurement method of claim 10, wherein mapping one of the internal signals to the first data signal comprises:
extracting a plurality of second data signals from the internal signals respectively; and
outputting, according to a selecting signal, one of the second signals as the first data signal.

12. The eye diagram measurement method of claim 10, wherein generating the count signals comprises:
comparing the first data signal with the signal values respectively, to output a plurality of trigger signals, wherein a first trigger signal of the trigger signals indicates that the first data signal is the same as a first signal value of the signal values; and
determining, by a plurality of counters, according to the trigger signals respectively, to perform the counting operation to output the count signals, wherein when a first counter of the counters receives the first trigger signal, the first counter performs the counting operation to update a corresponding count signal of the count signals.

13. The eye diagram measurement method of claim 12, wherein a plurality of second trigger signals of the trigger signals indicate that the first data signal is different from remaining signal values of the signal values, and when remaining counters of the counters receive the second trigger signals, the remaining counters do not perform the counting operation.

14. The eye diagram measurement method of claim 13, further comprising:
storing the count signals to provide the count signals to the external system for generating a statistic result associated with the present phase.

15. The eye diagram measurement method of claim 10, further comprising:
providing, according to a control signal, an eye diagram measurement value and one of a predetermined value associated with the electric device to a clock and data recovery circuit in the electronic device, in order to switch a phase of a clock signal of the electronic device from the present phase to a next phase.

16. The eye diagram measurement method of claim 10, wherein the first data signal is a pulse-amplitude modulation signal.

17. The eye diagram measurement method of claim 11, wherein the first data signal is a pulse-amplitude modulation signal.

18. The eye diagram measurement method of claim 12, wherein the first data signal is a pulse-amplitude modulation signal.

* * * * *